United States Patent [19]

Kokubo et al.

[11] Patent Number: 4,652,858

[45] Date of Patent: Mar. 24, 1987

[54] INTERPOLATIVE D/A CONVERTER

[75] Inventors: Masaru Kokubo; Shigeo Nishita, both of Kokubunji; Kazuo Yamakido, Nishitama, all of Japan

[73] Assignee: Hitachi, Ltd., Tokyo, Japan

[21] Appl. No.: 852,749

[22] Filed: Apr. 16, 1986

[30] Foreign Application Priority Data

Apr. 17, 1985 [JP] Japan ................................. 60-80131

[51] Int. Cl.$^4$ ............................................ H03M 1/66
[52] U.S. Cl. ............................................ 340/347 DA
[58] Field of Search ................ 340/347 DA, 347 AD; 375/27, 28, 29, 30, 31; 332/11 D

[56] References Cited

U.S. PATENT DOCUMENTS 4,301,446 11/1981 Petit ............................... 340/347 DA
4,467,316 8/1984 Musmann ..................... 340/347 DA
4,528,551 7/1985 Agrawal ....................... 340/347 DA Primary Examiner—Charles D. Miller
Attorney, Agent, or Firm—Antonelli, Terry & Wands

[57] ABSTRACT

An oversampling type digital-to-analog converter which has a light gradient overload and a high signal-to-noise ratio in spite of a comparatively low sampling frequency.

In a digital-to-analog converter wherein the difference between an oversampled digital input signal and a feedback signal is taken, such differences are integrated, the integral value is quantized to obtain the feedback signal, and part of the feedback signal is used as an analog output signal; a circuit for the quantization is constructed of a circuit which converts the integral value into a digital signal smaller in the number of bits than the digital input signal, and the feedback signal is obtained by integrating the outputs of the quantization circuit by means of a digital integral circuit.

7 Claims, 8 Drawing Figures

FIG. 5

| D0 | D1 | D2 | D3 | D4 | D5 | D6 | D7 | D8 | D9 | D10 | D11 | D12 | D13 | D14 | D15 | |
|----|----|----|----|----|----|----|----|----|----|-----|-----|-----|-----|-----|-----|---|
| 0  | 1  | 1  | 1  | 1  | 1  | 1  | 1  | 1  | 1  | 1   | 1   | 1   | 1   | 1   | 1   | LSB |
| 0  | 0  | 0  | 0  | 0  | 0  | 0  | 0  | 0  | 0  | 0   | 0   | 0   | 0   | 1   | 1   | |
| 1  | 1  | 1  | 1  | 1  | 1  | 1  | 1  | 1  | 1  | 1   | 1   | 1   | 1   | 1   | 1   | |
| 1  | 0  | 0  | 0  | 0  | 0  | 0  | 0  | 0  | 0  | 0   | 0   | 0   | 0   | 0   | 0   | MSB (sign) |

| Q0 | Q1 | Q2 | Q3 | Q4 | Q5 | Q6 | Q7 | Q8 | Ci | |
|----|----|----|----|----|----|----|----|----|----|---|
| 1  | 0  | 0  | 0  | 0  | 0  | 0  | 0  | 0  | 0  | LSB |
| 1  | 1  | 1  | 1  | 1  | 1  | 1  | 0  | 1  | 1  | |
| 0  | 0  | 0  | 0  | 0  | 0  | 0  | 0  | 0  | 0  | |
| 0  | 1  | 1  | 1  | 1  | 1  | 1  | 1  | 1  | 1  | MSB (sign) |

INTERPOLATIVE D/A CONVERTER

BACKGROUND OF THE INVENTION (1) Field of the Invention

The present invention relates to an interpolative digital-to-analog (D/A) converter, and more particularly to a D/A converter by which the digital signal of signals sampled at a sampling frequency several times higher than the Nyquist rate of the signals is converted into an analog signal. Especially, it relates to a D/A converter for a voice band signals etc. which is well suited for implementation as a semiconductor integrated circuit.

(2) Description of the Prior Art

As one system of a D/A converter of high precision for handling voice signals, there has been known an oversampling type D/A converter which is, in principle, capable of reducing the number of analog circuit elements and mitigating precisions to be required of constituent elements and which is well suited to be implemented by a semiconductor integrated circuit. However, as described in Report of the Institute of Electronics and Communication Engineering in Japan (CS83-198), National Conference Record No. 659, 1984 Communications' etc., the oversampling type D/A converter in a prior art needs a sampling frequency higher than several MHz in order to attain a desired S/N (signal-to-noise) ratio characteristic (e. g., 90 dB for an evaluation band of 4 kHz), so that high-speed operations are required of an operational amplifier, an analog switch etc. Moreover, since a difference PCM (pulse code modulation) signal is used as a digital signal being an input to a D/A converter, an analog integrator is necessitated on the output side of the D/A converter, and the analog integrator forms causes for spike noise and an offset voltage to worsen the S/N ratio, so that a result contradictory to the original purpose of improving the S/N ratio is produced.

SUMMARY OF THE INVENTION

The principal object of the present invention is to provide an interpolative digital-to-analog converter which affords a high S/N ratio in spite of a comparatively low sampling frequency. In particular, it is to provide a digital-to-analog converter which develops little noise ascribable to a gradient overload in spite of a low sampling frequency.

In order to accomplish the object, the present invention reduces quantum noise owing to the mitigation of bit precisions by utilizing a noise shaping technique (a method by which the frequency components of quantum noise are distributed in a high frequency region) employed in an oversampling type A/D converter and prevents a gradient overload from arising by adapting the variation width of a feedback signal to change on the basis of the sum of the difference between a last-sampled input signal and the feedback signal and the integrated result of such differences.

The above-mentioned and other features and objects of this invention will become more apparent by reference to the following description taken in conjunction with the accompanying drawings.

BRIEF DESCRIPTION OF THE DRAWINGS

FIG. 5 is a truth table of signals in the comparator 3;

Figure 1:
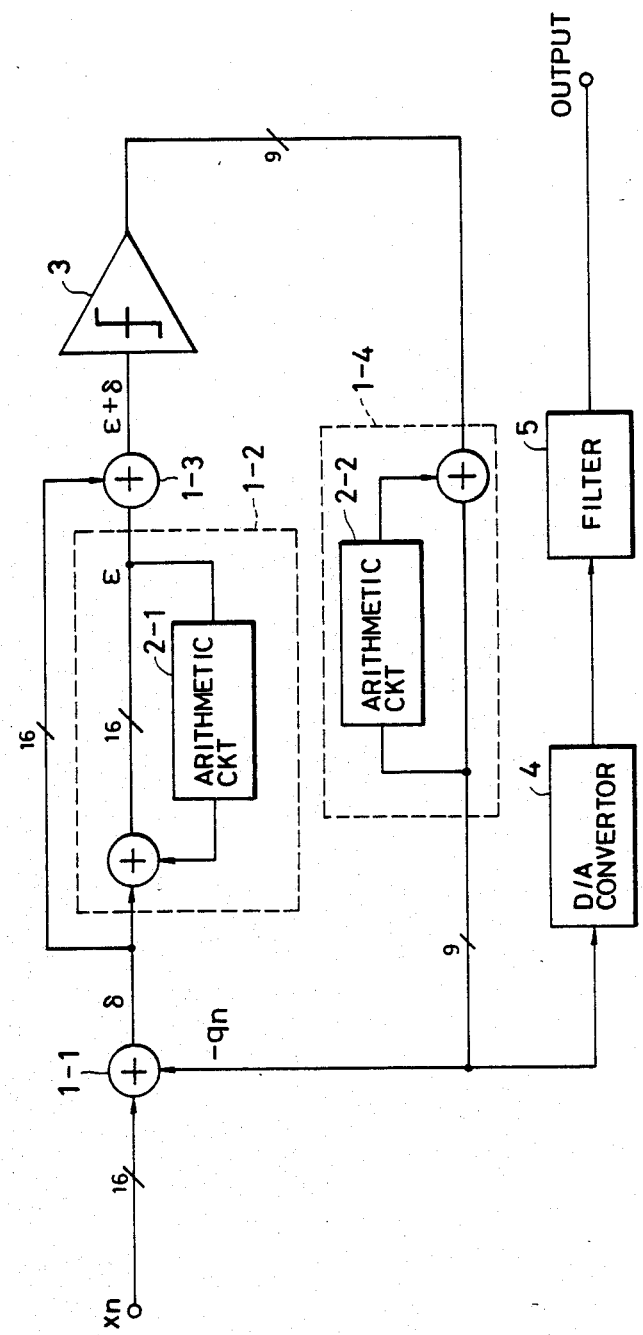
FIG. 1 is a block arrangement diagram of an embodiment of a D/A converter according to the present invention.

DESCRIPTION OF THE PREFERRED EMBODIMENTS:

FIG. 1 is a diagram showing the arrangement of an embodiment of an interpolative D/A converter according to the present invention. Referring to the figure, the difference $\delta$ between a digital input signal $x_n$ composed of a large number of oversampled bits and a digital feedback signal $q_n$ is produced by an arithmetic circuit 1-1. Such differences $\delta$ are integrated by an arithmetic circuit 1-2. The output integral signal $\delta$ of the circuit 1-2 and the aforementioned difference $\delta$ are added by an arithmetic circuit 1-3. The added output signal $\epsilon + \delta$ is quantized by a comparator 3, and the resulting signal is applied to an arithmetic circuit 1-4 and is integrated therein. The feedback signal $q_n$ is converted into an analog signal by a D/A converter 4. The analog signal being the output of the D/A converter is applied to a filter circuit 3, and the higher harmonics components thereof due to the sampling are removed by the filter. Symbols 2-1 and 2-2 denote registers.

The feature of the embodiment is that the output of the arithmetic circuit or integrator circuit 1-2 is quantized by the comparator 3. Quantization levels in this case is smaller in number than those of the input $x_n$, and an least two quantization levels are included in either minus or plus direction.

It is accordingly possible to solve the problem of a gradient overload which is involved when the sampling frequency of the input $x_n$ is low. The reason will be detailed later.

Now, the arrangement and operation of the embodiment in FIG. 1 will be described more in detail.

The operation of the embodiment will be explained assuming for the sake of brevity that the input signal $x_n$ be a digital signal the sampling frequency of which is 512 kHz and one sample of which consists of 16 bits and that the feedback signal $q_n$ be a digital signal of 9 bits.

Figure 2:
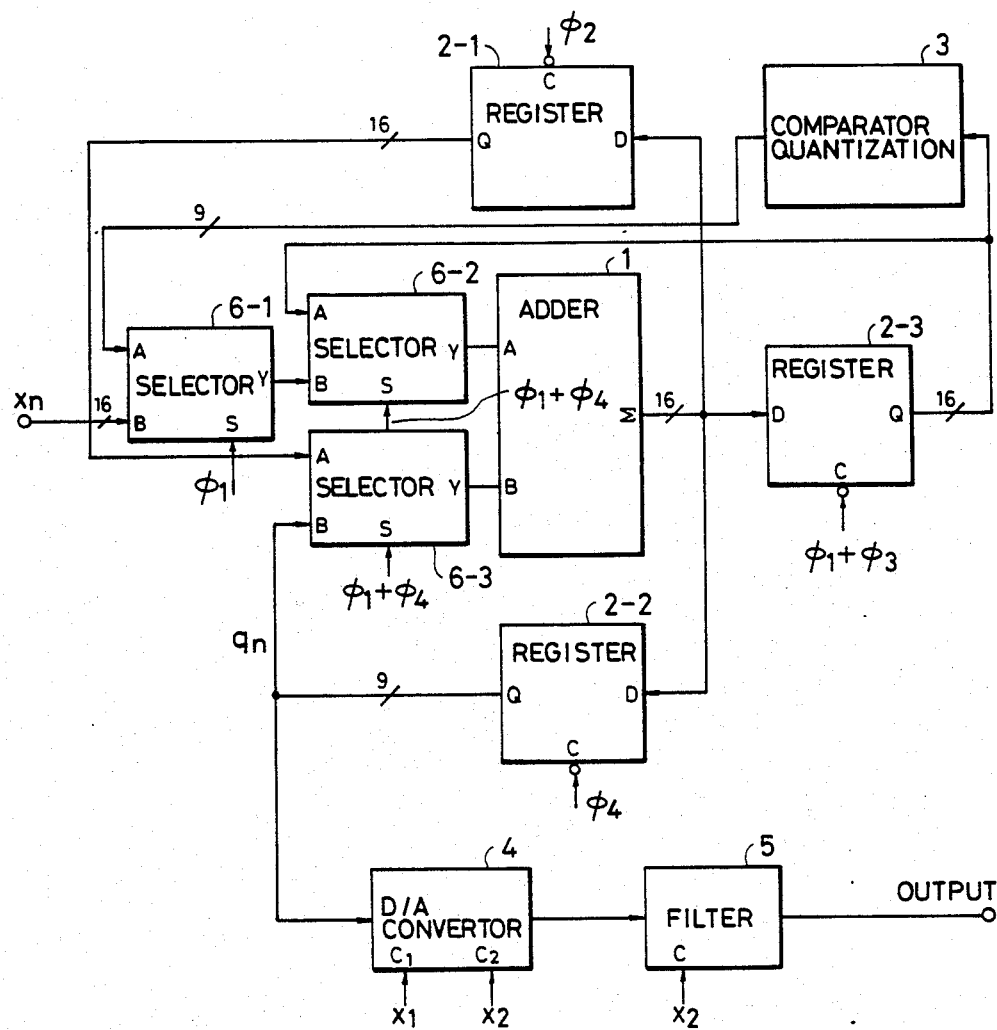
FIG. 2 is an arrangement diagram of another embodiment of the D/A converter according to the present invention.
Figure 3:
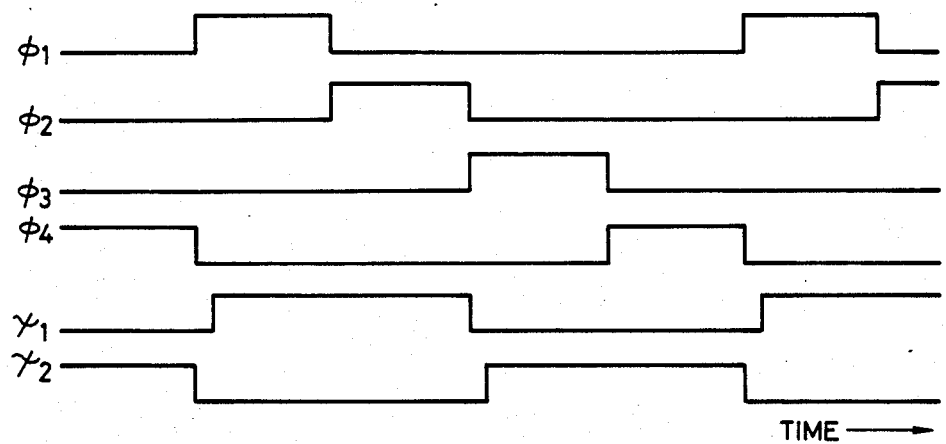
FIG. 3 is a time chart for explaining the operation of the embodiment in FIG. 2.

FIG. 2 shows the practicable arrangement of the interpolative D/A converter in FIG. 1, in which a single adder is used in time-sharing fashion as adders constituting the arithmetic circuits 1-1 to 1-4 in FIG. 1. The timing chart of timing signals $\phi_1$–$\phi_4$ and $\psi_1$, $\psi_2$ for use in the embodiment of FIG. 2 is shown in FIG. 3. The signals $\phi_1$–$\phi_4$ are obtained by dividing clock pulses of 512 kHz in four, and those $\psi_1$ and $\psi_2$ are clock pulses of 512 kHz not overlapping each other. In FIG. 2, each of selectors 6-1 to 6-3 is constructed of 16 bits, and it is so operated that when the timing signal applied to a terminal S is logic level "1", an input to a terminal B is selected and is delivered to a terminal Y, whereas when the timing signal is logic level "0", an input to a terminal A is selected and is delivered to the terminal Y. In addition, each of the register 2-1 and a register 2-3 is constructed of 16 bits, and the register 2-2 is constructed of 9 bits. These registers all have their outputs changed by the trailing edges of the clock pulses $\phi_1$–$\phi_4$ and hold the output statuses. While the registers 2-1 and 2-2 correspond to those in FIG. 1, the register 2-3 serves for making it possible to use the adder 1 in time-sharing fashion.

The operation of the present embodiment will now be explained. Here, the signal format of internal calculations is based on two's complements.

First, at the timing $\phi_1$, the difference $\delta = (x_n - q_n)$ between the input sampled signal $x_n$ and the feedback signal $q_n$ obtained by calculations up to the last-sampled signal $x_{n-1}$ is produced. More specifically, the input sampled signal $x_n$ is applied to the terminal A of the adder 1 via the selectors 6-1 and 6-2 at the timing $\phi_1$, while the feedback signal $q_n$ is applied to the terminal B of the adder 1 via the selector 6-3 at the timing $\phi_1$.

At the timing $\phi_2$, the selectors 6-2 and 6-3 select the inputs of their terminals A. Therefore, the terminal A of the adder 1 is supplied with the output of the register 2-3, and the terminal B thereof is supplied with the output of the register 2-1, namely, the integral value of the differences $\delta$ up to the last-sampled input $x_{n-1}$ (execution of the function of the adder 1-3 in FIG. 1).

The added value $\epsilon + \delta$ thus obtained is stored in the register 2-1 again. As a result, the integral of the differences up to the input sample $x_n$ has been performed. Subsequently, at the timing $\phi_3$, the selectors 6-2 and 6-3 select the inputs of their terminals A. Therefore, the contents of the registers 2-3 and 2-1 are added, and the result is stored in the register 2-3 again. In consequence, the sum $\epsilon + \delta$ between the integral signal $\epsilon$ corresponding to the input $x_n$ and the difference signal $\delta$ is stored in the register 2-3. The use of the value $(\epsilon + \delta)$ for updating the feedback signal $q_n$ is intended to attain the effect of estimating a feedback signal $q_{n+1}$ which corresponds to an input signal $x_{n+1}$ to be subsequently sampled. Thus, the follow-up property of the feedback signal $q_n$ to the input signal $x_n$ can be enhanced, and the gradient overload can be effectively suppressed.

Figure 4:
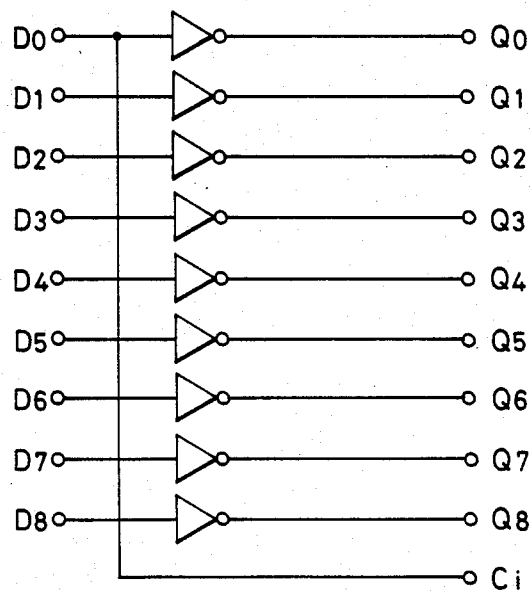
FIG. 4 is an arrangement diagram of an embodiment of a comparator 3 in FIG. 2.

Subsequently, the value of the register 2-3 is decided by the comparator 3 as shown in FIG. 4, and a coefficient for updating the feedback signal $q_n$ is output therefrom.

FIG. 4 shows an example of arrangement of the comparator 3. Though the input $(\epsilon + \delta)$ is a signal of 16 bits, the least bits $D_9$–$D_{15}$ are discarded because the comparison operation is, in other words, a quantization operation. As a result, in terms of a decimal number with a decimal point assumed at the ninth bit, a plus value which is at least 0 and less than 1 becomes 0, and a plus value which is at least 1 and less than 2 becomes 1. Besides, minus values are respectively rounded in the directions of increasing absolute values. Next, all the bits $D_0$–$D_8$ are inverted in order to simplify the calculation of the difference $\delta$ as stated before, and a carry $C_i$ is put into 1 when $(\epsilon + \delta)$ is minus. The carry $C_i$ is employed as the carry signal of the ninth bit of the full adder. Owing to this operation, 0, 1, 2, 3, ... become $-1, -2, -3, ...$, and $-1, -2, -3, ...$ become 1, 2, 3, 4, ..., respectively.

To sum up the above operations, the output of the comparator 3 is such that the absolute value of $(\epsilon + \delta)$ is taken and is rounded up, whereupon the sign is inverted. The output of the integrating arithmetic circuit 1-4 in FIG. 1 under the state under which the input signal is of a low frequency and the feedback signal is following it up favorably, changes only at the LSB at the utmost. Therefore, the absolute value of $(\epsilon + \delta)$ is not greater than 1. With the operations, even when the input signal has become a comparatively high frequency and the followup property of the feedback signal has worsened to bring $(\epsilon + \delta)$ into N times, the output of the comparator 3 becomes -N times to permit a quick follow-up response. FIG. 5 is a truth table showing the above operations of the comparator.

Subsequently, at the timing $\phi_4$, the selector 6-1 selects the input of the terminal A, and the selectors 6-2 and 6-3 select the inputs of the terminals B. Therefore, the adder 1 adds the output of the comparator 3 and the content of the register 2-2 and stores the sum in the register 2-2 again. Owing to this operation, the integral calculation of the arithmetic circuit 1-4 in FIG. 1 has been executed.

Figure 6:
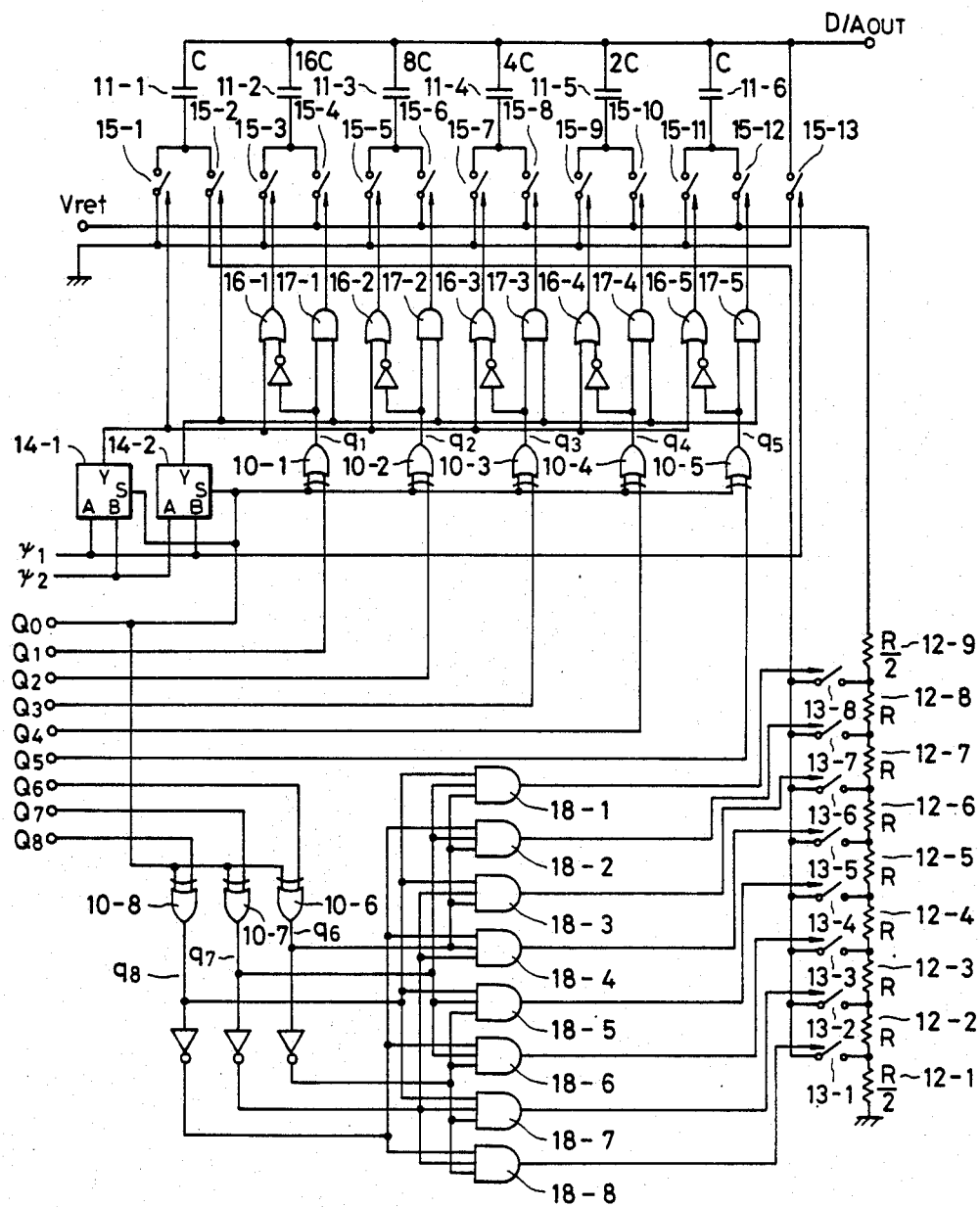
FIG. 6 is an arrangement diagram of an embodiment of a D/A converter 4 in FIG. 1.

FIG. 6 shows an example of arrangement of the D/A converter 4 illustrated in FIGS. 1 and 2. First, the signal in the two's complement format is converted into a signal having a sign and an absolute value. As a method for the conversion, it is common to take the exclusive OR between all the bits $Q_1$–$Q_8$ except the sign bit $Q_0$ and the sign and to add 1 when the result is minus. However, in order to simplify the circuit arrangement, the operation of adding 1 for the minus sum is replaced here with a measure in which a plus offset voltage corresponding to ½LSB is applied to the D/A converter for the plus sum and a minus offset voltage corresponding to ½LSB is applied thereto for the minus sum as will be described later.

The D/A converter of the present embodiment is constructed of the charge redistribution type which employs the combination of capacitors and resistors (C-arrays 11-1 to 11-6) and (R-strings 12-1, ..., 12-9). Among them, the capacitances of the C-arrays correspond to the upper 5 bits $Q_1$–$Q_5$ of the input signal bits $Q_n$ (n=1–8) and are respectively weighted by the powers of 2 (1, 2, 4, 8, 16). The R-strings are divided in eight in correspondence with the lower 3 bits $Q_6$–$Q_8$, and tap voltages are selected by analog switches 13-1, ... and 13-9 and are connected to the C-arrays through unit capacitances separately provided. As regards the method of dividing the R-strings, resistances of R/2 are inserted between the ground and a reference voltage $V_{ref}$, whereby the aforementioned offset voltages can be superposed.

Now, the operation of the D/A converter will be explained concerning a case where a sign signal is plus. At the timing $\psi_1$ in FIG. 3, the upper and lower electrodes of all the C-arrays are simultaneously grounded through switches 15-1, 15-3, 15-5, ... and 15-13 by selectors 14-1 and 14-2, to discharge charges in all the capacitors C. Subsequently, after the integral calculation 1-4 in FIGS. 1 and 2 has ended, the upper electrodes of the capacitors are rendered free potentials at the timing $\psi_4$, while at the same time the lower electrodes of the capacitors corresponding to the bits becoming "1" among the bits $Q_1$–$Q_5$ are rendered the reference voltage $V_{ref}$ through the selector 14-2 through gates 10-1, ... and 10-6, 16-1, ... and 16-5 and 17-1, ... and 17-5. As regards potentials corresponding to the bits $Q_6$–$Q_8$, these 3 bits are decoded by logic circuits including gates 10-6, ... 10-8 and 18-1, ... and 18-8, the analog switches 13-1, ... and 13-9 corresponding to the decoded results are turned on, and potentials based on the division ratios of the reference voltage $V_{ref}$ by the R-strings are connected to the lower electrodes of the unit capacitance capacitors. When the respective bits are denoted by $q_1$–$q_8$, the output $V_o$ of the D/A converter at this time becomes:

$$V_o = (V_{ref}/255)(2^7 q_1 + 2^6 q_2 + \ldots + 2^0 q_8 + 0.5)$$

On the other hand, in case of a minus sign, at the timing $\psi_1$, the upper electrodes of the capacitors are grounded, and the lower electrodes of the capacitors corresponding to the bits becoming "1" among the bits $q_1$–$q_8$ are connected to the reference voltage $V_{ref}$, while the lower electrodes of the capacitors corresponding to the bits becoming "0" are grounded, whereby charges corresponding to the bits $q_1$–$q_8$ are stored in the C-arrays. Subsequently, at the timing $\psi_2$, the upper electrodes of the capacitors are released to free potentials, and simultaneously, all the lower electrodes of the capacitors connected to the reference voltage $V_{ref}$ are switched to be grounded.

Owing to the above operations, the plus and minus D/A conversion can be performed with only one reference voltage.

Figure 7:
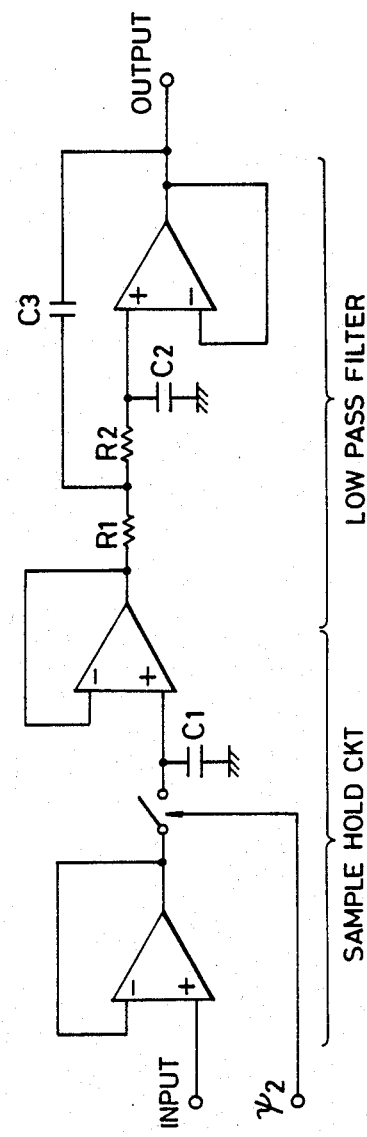
FIG. 7 is a diagram showing a sample-and-hold circuit and a filter circuit for use in an embodiment of the present invention.

The output signal of the D/A conversion is delivered as a D/A conversion waveform smoothed through a sampleand-hold circuit and a filter circuit which are exemplified in FIG. 7.

Figure 8:
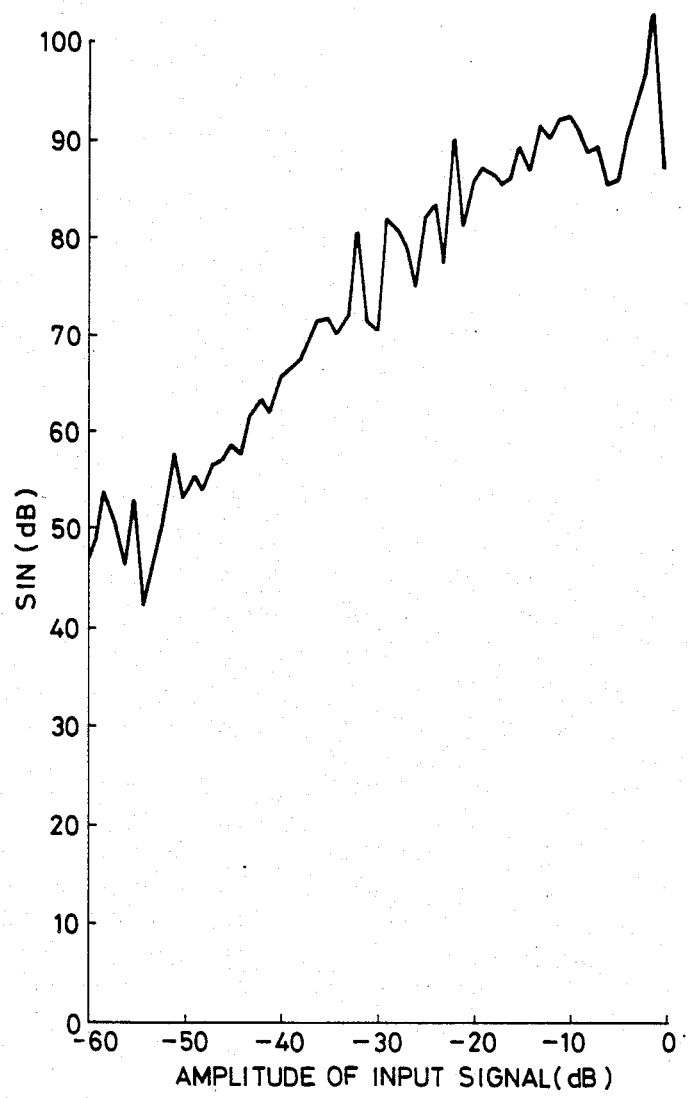
FIG. 8 is a diagram of the S/N characteristic of an embodiment of the D/A converter according to the present invention.

Shown in FIG. 8 is the signal (1 kHz)-to-noise (0-4 kHz) power ratio characteristic of an interpolative D/A converter fabricated in conformity with the system and arrangement according to the present invention thus far described.

As described above in detail, according to the present invention, a favorable D/A conversion characteristic is attained even when signals are sampled at a frequency of or below ¼ of that in the prior art. Therefore, the characteristics of analog circuit elements can be sharply mitigated. In particular, a D/A converter circuit which can be integrated on an identical chip with a logic LSI for digital signal processing, or the like can be realized with ease.

We claim:

1. An interpolative digital-to-analog converter for converting a digital signal into an analog signal, comprising:
   a first arithmetic circuit which produces a difference between a digital input signal and a digital feedback signal having a number of bits smaller than that of a digital input signal,
   a second arithmetic circuit which integrates such differences,
   a third arithmetic circuit which produces a sum between the output of said first arithmetic circuit and that of said second arithmetic circuit,
   a comparator which quantizes the output of said third arithmetic circuit,
   a fourth arithmetic circuit which integrates an output of said comparator and generates the feedback signal,
   a digital-to-analog converter which converts the feedback signal into an analog signal, and
   a low-pass filter which removes higher harmonics components from the output of said digital-to-analog converter.

2. An interpolative digital-to-analog converter according to claim 1, wherein an absolute value of the output of said comparator is greater than the output of said third arithmetic circuit.

3. An interpolative digital-to-analog converter according to claim 2, wherein said digital-to-analog converter for converting the feedback signal into the analog signal includes means to apply an offset voltage corresponding to ½ least significant bit.

4. An interpolative digital-to-analog converter according to claim 3, wherein adders which constitute said first, second, third and fourth arithmetic circuits are so constructed that a single adder is used in common in time-sharing fashion.

5. An interpolative digital-to-analog converter according to claim 1, wherein said digital-to-analog converter for converting the feedback signal into the analog signal includes means to apply an offset voltage corresponding to ½ least significant bit.

6. An interpolative digital-to-analog converter according to claim 5, wherein adders which constitute said first, second, third and fourth arithmetic circuits are so constructed that a single adder is used in common in time-sharing fashion.

7. An interpolative digital-to-analog converter according to claim 1, wherein adders which constitute said first, second, third and fourth arithmetic circuits are so constructed that a single adder is used in common in time-sharing fashion.

* * * * *